(12) United States Patent
Verheijen

(10) Patent No.: US 12,336,084 B2
(45) Date of Patent: Jun. 17, 2025

(54) HUMIDITY-ADJUSTED POWER SUPPLY

(71) Applicant: Xerox Corporation, Norwalk, CT (US)

(72) Inventor: Hendrikus Adrianus Anthonius Verheijen, Helden (NL)

(73) Assignee: Xerox Corporation, Norwalk, CT (US)

( * ) Notice: Subject to any disclaimer, the term of this patent is extended or adjusted under 35 U.S.C. 154(b) by 807 days.

(21) Appl. No.: 17/560,531

(22) Filed: Dec. 23, 2021

(65) Prior Publication Data

US 2023/0209699 A1 Jun. 29, 2023

(51) Int. Cl.
*H05K 1/02* (2006.01)

(52) U.S. Cl.
CPC ......... *H05K 1/0212* (2013.01); *H05K 1/0213* (2013.01); *H05K 2201/10151* (2013.01)

(58) Field of Classification Search
CPC ............... H05K 1/0213; H05K 1/0212; H05K 2201/09972; H05K 1/0262; H05K 2201/10151; G03G 21/203; G03G 15/80; G03G 15/1675
See application file for complete search history.

(56) References Cited

U.S. PATENT DOCUMENTS

| | | | |
|---|---|---|---|
| 6,621,055 B2 | 9/2003 | Weber et al. | |
| 6,670,557 B2 | 12/2003 | Gehrke et al. | |
| 7,387,024 B2 | 6/2008 | Itakura et al. | |
| 8,102,629 B2 | 1/2012 | Harris et al. | |
| 8,823,535 B2 | 9/2014 | Klein et al. | |
| 9,012,811 B2 | 4/2015 | White | |
| 9,164,477 B2 | 10/2015 | Verheijen | |
| 9,513,053 B2 | 12/2016 | Zielinski et al. | |
| 10,281,938 B2 | 5/2019 | Mowris et al. | |
| 10,306,776 B1 | 5/2019 | Pape et al. | |
| 10,338,129 B2 | 7/2019 | Shibata | |
| 2013/0219742 A1* | 8/2013 | Field .................. | G02B 27/0006 34/565 |
| 2014/0356005 A1* | 12/2014 | Sakamoto .......... | G03G 15/1675 399/45 |
| 2017/0114316 A1* | 4/2017 | Newstrom ............. | C12M 23/46 |

* cited by examiner

*Primary Examiner* — Ibrahime A Abraham
*Assistant Examiner* — Kuangyue Chen
(74) *Attorney, Agent, or Firm* — Gibb IP Law Firm, LLC

(57) ABSTRACT

A humidity-adjusted power supply includes a power supply circuit (e.g., relatively higher-voltage circuit) connected to a printed circuit board. The power supply circuit is adapted to provide output voltage to a voltage load. The humidity-adjusted power supply also includes a humidity control circuit (e.g., relatively lower-voltage circuit) connected to the printed circuit board adjacent the power supply circuit. The humidity control circuit outputs a heater control signal to a heater that is also connected to the printed circuit board. The heater is in a location to receive the heater control signal from the humidity control circuit. The power supply circuit and the humidity control circuit are positioned, relative to each other, on the printed circuit board to experience the same environmental conditions.

7 Claims, 4 Drawing Sheets

HUMIDITY-ADJUSTED POWER SUPPLY

BACKGROUND

Systems and methods herein generally relate to power supplies and more particularly to power supplies that are used in humid environments.

For some high-voltage power supply applications it is useful that there is no (or only little) current leaking away from the high-voltage output circuit because such leakage reduces output current. One example of such an application is the high-voltage direct current (HVDC) source for charging the bias transfer roll (BTR) in a toner-based printer. Typically, voltages of up to 6 kV are used to obtain currents well below 100 uA. The current source must have an accuracy of microamps.

High-voltage circuits on printed circuit boards (PCB's) can easily leak many microamps of current if they are situated in a humid environment. In high humidity environments, current flows across the PCB surfaces because the PCB material has the ability to absorb and adsorb water, which makes the surface relatively conductive. Factors involved in such current leakage are the material properties and the level of contamination of the surface (e.g., flux residue). This effect is especially noticeable at high voltages and low currents, where operations rely on the insulating properties of the PCB. Therefore, high voltage/low current applications (e.g., HVDC BTR's) are particularly sensitive to small humidity changes that can result in out of specification behavior.

There are a number of methods to prevent, reduce or compensate for such current leakage. Some structures encapsulate the high-voltage circuit in a housing so that it is not exposed to the humid environment. These (potting) techniques are effective, but relatively costly. Additionally, if the high-voltage output is to be made available on the PCB for interfacing, this technique may not be completely adequate.

There are shielding techniques, where the high-voltage (circuits) are surrounded or separated by conductive shields. The leakage current, picked-up by the shield, is measured and used to correct the output current or voltage accordingly. This works if the shield is nearby the high-voltage circuit and completely surrounds the circuit. However, such shields can themselves increase leakage and can potentially cause insulation breakdown (e.g., arcing/tracking). Also, on printed circuit boards that use single-sided copper, the leakage across the top side surface (where there is no shield) cannot be measured rendering such shielding techniques inaccurate.

Some solutions use a humidity sensor. With this, the relative humidity of the general machine environment is monitored and fed back to the processor unit for changing the setpoints required for maintaining the image quality. One of these setpoints is the BTR current. This approach does not take into account that the (relative) humidity in the area where the high-voltage power supply (HVPS) resides, which can be completely different. Also, the contamination degree of the PCB surface and the content of previously absorbed water in the PCB is not a constant factor over time. Furthermore, such structures rely on an HVPS manufactured with controlled PCB cleanliness. Thus, the effectiveness of humidity sensors relies on the ability to calibrate and control the correlation between the humidity sensor and the compensation applied to the output voltage.

SUMMARY

Various apparatuses herein can be, for example, printers or other similar devices that use power supplies on printed circuit boards. The apparatuses herein have a humidity-adjusted power supply that includes a power supply circuit (e.g., relatively higher-voltage circuit) connected to a printed circuit board. The power supply circuit is adapted to provide output voltage to a voltage load (e.g., printing components) of the apparatus.

The humidity-adjusted power supply also includes a humidity control circuit (e.g., a lower-voltage circuit relative to the power supply circuit) connected to the printed circuit board adjacent the power supply circuit. The power supply circuit and the humidity control circuit are positioned, relative to each other, on the printed circuit board to experience the same environmental conditions (e.g., temperature, humidity, contamination, etc.). The power supply circuit and the humidity control circuit have components sized and connected to experience correlated current changes as the environmental conditions change.

The humidity control circuit includes an amplifier connected to a humidity sensor, and a signal converter connected to the amplifier and the heater. The power supply circuit includes a transformer component providing the output voltage. The amplifier is connected to receive a portion of the output voltage from the transformer component (a proportional voltage that is lower than, and proportional to, the output voltage).

Based on output from the amplifier, the signal converter supplies a heater control signal to a heater that is also connected to the printed circuit board. Thus, the heater is in a location on the printed circuit board to receive the heater control signal from the humidity control circuit and can be connected to an outer surface of the printed circuit board or located within the printed circuit board.

These and other features are described in, or are apparent from, the following detailed description.

BRIEF DESCRIPTION OF THE DRAWINGS

Various exemplary systems and methods are described in detail below, with reference to the attached drawings, in which.

DETAILED DESCRIPTION

As mentioned above, high voltage/low current applications (e.g., HVDC BTR's) are particularly sensitive to small humidity changes that can result in out of specification behavior. In order to address these challenges, the devices herein include a lower voltage "sister" circuit on the same board as the high voltage circuit of a power supply that is connected to a heater that reduces moisture levels and associated current leakage. This low voltage circuit leaks current is correlated to the higher-voltage circuit to essentially act as a humidity sensor that control the heater to maintain constant performance.

Figure 1:
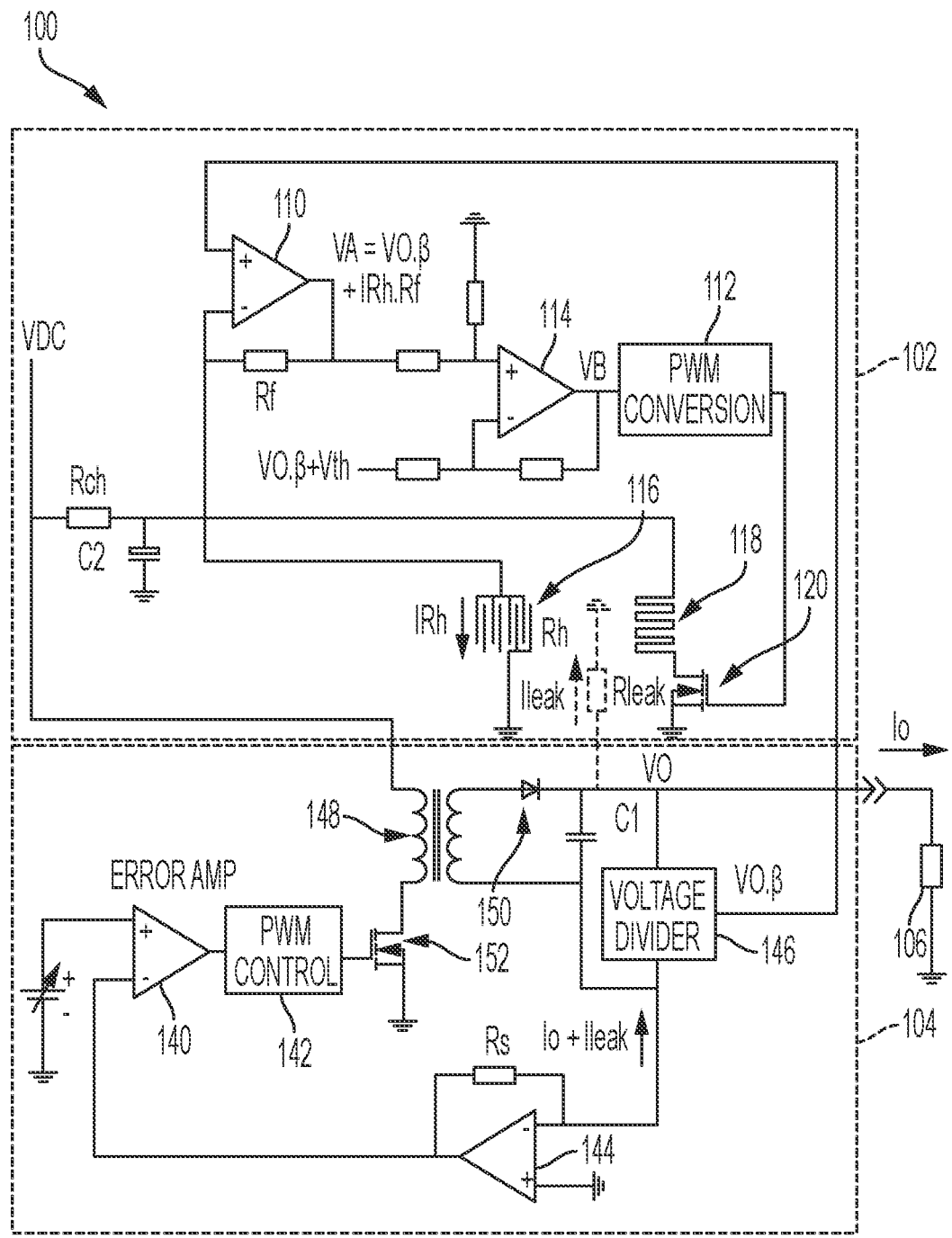
FIG. 1 is a schematic diagram illustrating a humidity-adjusted power supply circuit herein.

As shown in FIG. 1, apparatuses herein (e.g., printers or other similar devices) include a humidity-adjusted power supply 100 that has a power supply circuit 104 (e.g., relatively higher-voltage circuit) connected to a printed circuit board (item 160, shown in FIGS. 2-5, discussed below). The power supply circuit 104 is adapted to provide output voltage VO to a voltage load 106 (e.g., printing components) of the apparatus. While a power supply for a printing component (e.g., bias transfer roll) is used in some examples herein, the disclosed power supply 100 is not limited to only being used with printing devices but, instead, the disclosed power supply 100 can be used with any circuit within any type of device that experiences high-humidity conditions.

The humidity-adjusted power supply 100 also includes a humidity control circuit 102 (e.g., a lower-voltage circuit relative to the power supply circuit) connected to the printed circuit board adjacent the power supply circuit 104. The power supply circuit 104 and the humidity control circuit 102 have components sized and connected to experience correlated current changes as the environmental conditions (e.g., temperature, humidity, contamination, etc.) change.

The humidity control circuit 102 includes a humidity-controlled amplifier 110 connected to a humidity sensor 116. A differential amplifier 114 is connected to receive output from the humidity-controlled amplifier, and a signal converter 112 is connected to the differential amplifier 114 and the heater 118. The power supply circuit 104 includes a transformer component 148 providing the output voltage VO. The humidity-controlled amplifier 110 is connected to receive a portion of the output voltage VO from the transformer component 148 (e.g., a proportional voltage that is lower than, and proportional to, the output voltage VO).

Based on output from the amplifier 110 the signal converter 112 supplies a heater control signal to a heater 118 that is also connected to the printed circuit board. Thus, the heater 118 is in a location on the printed circuit board to receive the heater control signal from the humidity control circuit 102.

As shown in FIG. 1, the power supply circuit 104 includes a flyback converter with rectification that generates a DC high-voltage Io. Specifically, an error amplifier 140 supplies voltage to a pulse width modulated (PWM) controller 142 that drives a transistor 152 to supply the input DC voltage (VDC) to a primary winding of the transformer (inductor) 148.

The energy in the primary winding of the transformer is transferred to the secondary winding of the transformer. A diode 150 rectifies the voltage from the secondary winding of the transformer 148 while a converter capacitor C1 smooths the rectified voltage to output voltage VO. A feedback circuit having a transresistance amplifier 144 (with feedback resistor Rs) is used to convert the output current Io into a voltage suitable to be compared with voltage VSET at the error amplifier 140 input. In this way the error amplifier 140 makes corrections required to control output current Io. In operation, the transformer 148 polarity is usually reversed such that when the transistor 152 is on, current flows in the primary winding. However, the rectifying diode 150 is reverse biased and current does not flow in the secondary winding. The energy is stored in the transformer 148 until when the transistor 152 is turned off. The stored energy produces a current that forward biases the rectifying diode 150 which rectifies it to produce the DC output VO.

If the output current is Io and if there is no leakage (Ileak=0), the voltage at the inverting input of the error amplifier 140 is Io.Rs. The output current Io can be set with setting voltage VSET according Io=VSET/Rs. If there is leakage, the voltage at the inverting input of the error amplifier 140 is (Io+Ileak).Rs and consequently Io=VSET/Rs-Ileak. In other words, the output current Io is Ileak lower than expected because the leakage current Ileak is considered to be in the output current. In order to address this, as noted above, structures herein also include a voltage divider 146 that supplies proportional voltage VO.β (which is a portion of the output voltage VO from the transformer component 148 and is sometimes referred to herein as a proportional voltage) to the humidity control circuit 102 that uses the humidity sensor 116 and the heater 118 to reduce moisture levels and the correlated current leakage Ileak.

As shown in FIG. 1, in the humidity control circuit 102, output from the humidity sensor 116 is supplied as one input to the humidity-controlled amplifier 110 (which can be a high-impedance, transresistance amplifier or other appropriate amplifier). While the illustrated humidity sensor 116 can be, for example, a small coupon with a copper comb pattern, any form of humidity sensor whether currently known or developed in the future can be used with the devices herein. In such implementations, the pattern of the humidity sensor 116 can include two terminals and interleaved tracks.

The second input VO.β to the humidity-controlled amplifier 110 comes from the voltage divider 146 which provides the proportional voltage VO.β to the humidity-controlled amplifier 110. Receiving the proportional voltage VO.β causes the voltage input to the humidity-controlled amplifier 110 to be correlated to the output voltage VO of the high-voltage current source 148, where the correlation is controlled by the voltage divider 146.

The humidity-controlled amplifier 110 operates using the current flowing through the humidity sensor 116 to ground and the proportional voltage VO.β to output an initial heater control voltage VA (where VA=VO.β+IRh.Rf). The resistor Rf converts the current IRh through the humidity sensor 116 to a voltage that is added to the proportional voltage VO.β when generating the initial heater control voltage VA.

Thus, the current leakage IRh across the comb pattern of conductors of the humidity sensor 116 provides a measure of the local humidity resulting from the PCB's water absorption and adsorption that is used by the humidity-controlled amplifier 110 when generating the initial heater control voltage VA. The current leakage IRh through the humidity sensor 116 correlates to the current leakage Ileak from the high-voltage circuit 104 because the high-voltage circuit 104 and humidity sensor 116 are both exposed to the same humidity conditions since both are located on the same PCB material and both experience the same surface condition.

As shown in FIG. 1, the initial heater control voltage VA is supplied to a differential amplifier 114 that also receives a threshold voltage VO.β+Vth. When the heater control voltage VA equals or exceeds the threshold voltage VO.β+Vth, the differential amplifier 114 outputs an intermediate heater control voltage VB, which is converted to a pulse width modulated (PWM) heater control signal by a PWM converter 112. The heater control signal controls a transistor 120 that turns the heater 118 on or off by completing or opening the circuit from the voltage source VDC through the heater 118 to ground.

Thus, the threshold value Vth prevents the PWM converter 112 from generating output until the leakage exceeds the threshold value Vth, which limits the use of the heater 118 to higher humidity conditions. In this way, the value selected for Vth establishes where the system will find an equilibrium balance between heater utilization and current leakage in a constantly higher humidity environment, and such can be adjusted by changing Vth.

There are several PWM schemes possible with the PWM converter 112 including variable on time with fixed frequency, fixed on time with variable frequency, etc. With the structures herein, the duty cycle is a function of the intermediate heater control voltage VB. If excess leakage occurs, it will occur in a correlated way in both the humidity sensor 116 (IRh) and the power supply circuit 104 (Ileak), in which case the PWM heater control duty cycle applied to the heater 118 will increase from 0% to a value that is correlated to the intermediate heater control voltage VB.

The heater 118 can be any resistive heater and may include a thin, relatively long, copper trace routed in close proximity of the high-voltage circuit 104 where the current leakages Ileak occur and where the humidity sensor 116 is located. The pulse driven heater 118 increases the local temperature and therewith decreases the local relative humidity level such that current leakage is reduced to an acceptable level. The correlation between the conductivity of the humidity sensor 116 and the current leakage Ileak from the high-voltage circuit 104 causes the heater 118 to operate and decrease the humidity to an acceptable level. Since the heater traces are in close proximity of high-voltage circuits 104, clearance and creepage distances are taken into account, noting that PCB laminate has very good electrical insulating properties.

In the drawings various resistors are shown as rectangles, such as resistor Rch that supports capacitor C2. The pulse energy to power the heater 118 can be at least partially drawn from capacitor C2 to prevent high supply (VDC) current peaks. The off-time is used to re-charge the capacitor C2 via resistor Rch.

In FIG. 1, Rh represents the humidity sensor 116 resistivity and the leakage can be modelled with a resistor Rleak as shown using broken lines in FIG. 1. As shown in FIG. 1, the output of the high-impedance operational amplifier 110 equals VA=VO.β+IRh.Rf. The differential amplifier 114 subtracts a voltage of at least VO.β, say VO.β+Vth. Then the output voltage is: VB=IRh.Rf−Vth. Threshold voltage Vth determines the value of sensor current IRh where VB>0. This is the value where the PWM converter 112 starts pulsing and thus the heater 118 activates. So, the heater 118 activates if the humidity sensor 116 current is IRh>Vth/Rf. This produces a better match between the humidity sensor 116 leakage and the high-voltage circuit leakage Ileak and results in a better control of the relative humidity.

Because of the slow effects of humidity, the PWM frequency of the PWM converter 112 does not need to be high. Fast MOSFET switching is therefore not required and EMC issues can be prevented. It should be noted that a moderate temperature rise is already effective for reducing the relative humidity. As a rule of thumb, a 10° C. rise of the air temperature already halves the relative humidity. Based on a typical heater trace resistance of several Ohms, it can be found that only small duty cycles are required. Most implementations only consume hundreds of milliwatts at equilibrium. Inner heater traces are even more effective because the heat conduction to the board surface is better.

Figure 2:
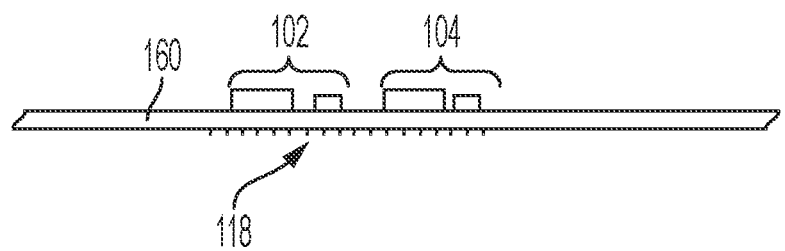
FIGS. 2-5 are cross-sectional conceptual diagrams of humidity-adjusted power supplies herein that utilize differently located heaters.
Figure 3:
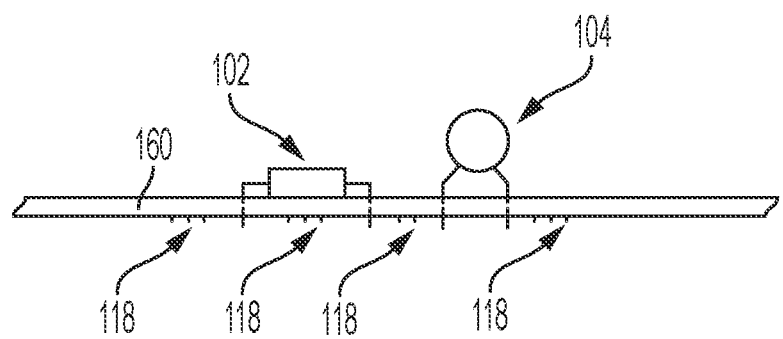
Figure 4:
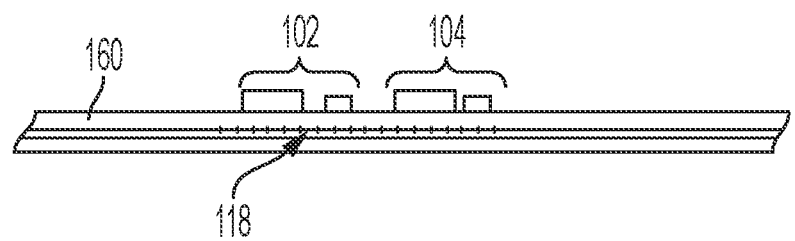
Figure 5:
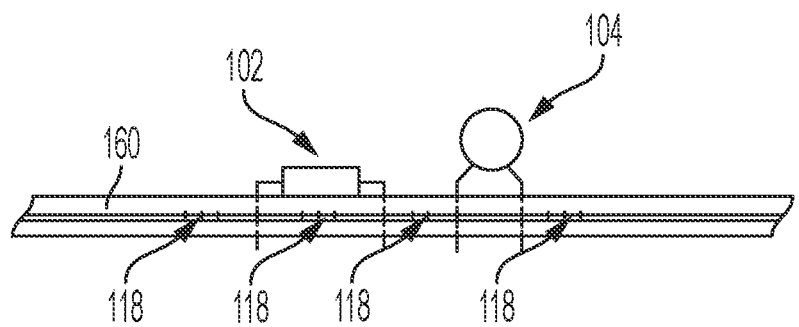

FIGS. 2-5 are cross-sectional conceptual diagrams of humidity-adjusted power supplies 100 herein that utilize differently located heaters 118 where the heater 118 can be either on the PCB surface 160 or in an inner layer of a multi-layer board 160. Therefore, in FIGS. 2 and 4, the power supply circuit 104 and the humidity control circuit 102 are positioned on the printed circuit board 160, while in FIGS. 3 and 5, the power supply circuit 104 and the humidity control circuit 102 are connected to the printed circuit board 160 using leads. In all such structures the power supply circuit 104 and the humidity control circuit 102 are positioned to experience the same environmental conditions from the printed circuit board 160. As shown in FIGS. 2-3, the heater 118 can be connected to the outer surface of the printed circuit board 160, while FIGS. 4-5 illustrate that the heater 118 can be located within the printed circuit board.

Figure 6:
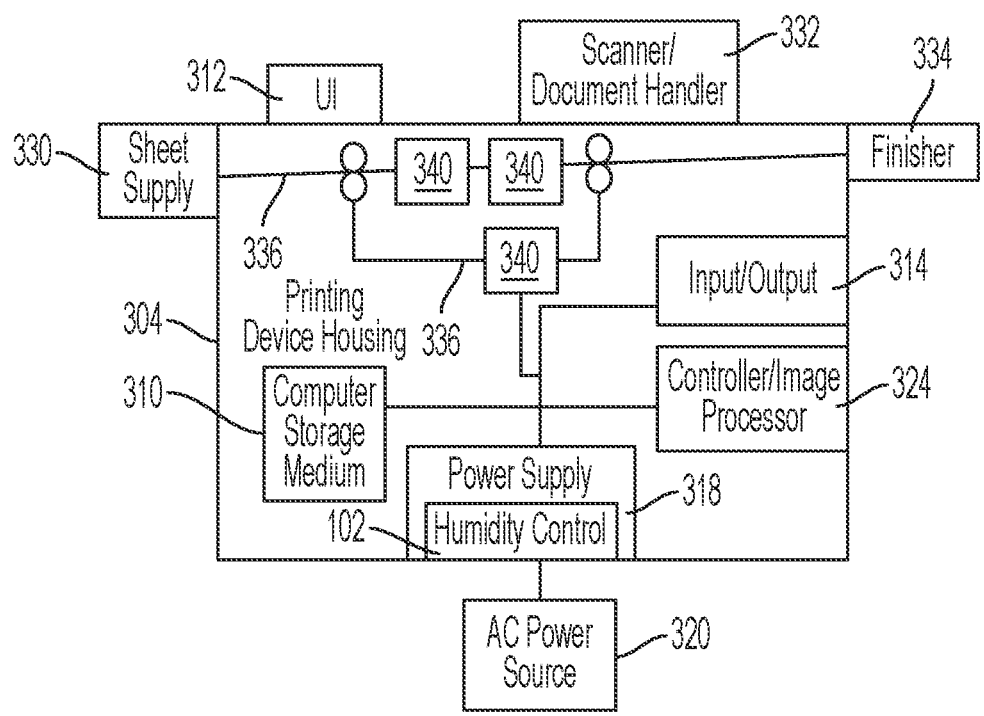
FIG. 6 is a schematic diagram illustrating devices herein.

FIG. 6 illustrates a computerized device that is a printing device 304, which can be used with systems and methods herein and can comprise, for example, a printer, copier, multi-function machine, multi-function device (MFD), etc. The printing device 304 includes a controller/tangible processor 324 and a communications port (input/output) 314 operatively connected to the tangible processor 324 and to the computerized network external to the printing device 304. Also, the printing device 304 can include at least one accessory functional component, such as a user interface (UI) assembly 312. The user may receive messages, instructions, and menu options from, and enter instructions through, the user interface or control panel 312.

The input/output device 314 is used for communications to and from the printing device 304 and comprises a wired device or wireless device (of any form, whether currently known or developed in the future). The tangible processor 324 controls the various actions of the computerized device. A non-transitory, tangible, computer storage medium device 310 (which can be optical, magnetic, capacitor based, etc., and is different from a transitory signal) is readable by the tangible processor 324 and stores instructions that the tangible processor 324 executes to allow the computerized device to perform its various functions, such as those described herein. Thus, as shown in FIG. 6, a body housing has one or more functional components that operate on power supplied from an alternating current (AC) source 320 by the power supply 318. The power supply 318 can comprise a common power conversion unit, power storage element (e.g., a battery, etc.), etc. Further, the power supply 318 shown in FIG. 6 conceptually represents all power supplies, inverters, amplifiers, etc., that may be used at different locations for different components of the printing device 304 and any of such devices can include the humidity control circuit 102 that is discussed above. In one example, the humidity-adjusted power supply 100 is just one of the many power supply devices item 318 in FIG. 6 conceptually represents.

The printing device 304 also includes at least one marking device (printing engine(s)) 340 operatively connected to a specialized image processor 324 (that is different from a general-purpose computer because it is specialized for processing image data), a media path 336 positioned to supply continuous media or sheets of media from a sheet supply 330 to the marking device(s) 340, etc. After receiving various markings from the printing engine(s) 340, the sheets of media can optionally pass to a finisher 334 which can fold, staple, sort, etc., the various printed sheets. Also, the printing device 304 can include at least one accessory functional component (such as a scanner/document handler 332 (automatic document feeder (ADF)), etc.) that also operate on the power supplied from the external power source 320 (through the power supply 318).

The one or more printing engines 340 are intended to illustrate any marking device that applies a marking material (toner, inks, etc.) to continuous media or sheets of media, whether currently known or developed in the future.

Many computerized devices are discussed above. Computerized devices that include chip-based central processing units (CPU's), input/output devices (including graphic user interfaces (GUI), memories, comparators, tangible processors, etc.) are well-known and readily available devices produced by manufacturers such as Dell Computers, Round Rock TX, USA and Apple Computer Co., Cupertino CA, USA. Such computerized devices commonly include input/output devices, power supplies, tangible processors, electronic storage memories, wiring, etc., the details of which are omitted herefrom to allow the reader to focus on the salient aspects of the systems and methods described herein. Similarly, printers, copiers, scanners and other similar peripheral equipment are available from Xerox Corporation, Norwalk, CT, USA and the details of such devices are not discussed herein for purposes of brevity and reader focus.

The terms printer or printing device as used herein encompasses any apparatus, such as a digital copier, bookmaking machine, facsimile machine, multi-function machine, etc., which performs a print outputting function for any purpose. The details of printers, printing engines, etc., are well-known and are not described in detail herein to keep this disclosure focused on the salient features presented. The systems and methods herein can encompass systems and methods that print in color, monochrome, or handle color or monochrome image data. All foregoing systems and methods are specifically applicable to electrostatographic and/or xerographic machines and/or processes.

Additionally, terms such as "adapted to" mean that a device is specifically designed to have specialized internal or external components that automatically perform a specific operation or function at a specific point in the processing described herein, where such specialized components are physically shaped and positioned to perform the specified operation/function at the processing point indicated herein (potentially without any operator input or action). In the drawings herein, the same identification numeral identifies the same or similar item.

While some exemplary structures are illustrated in the attached drawings, those ordinarily skilled in the art would understand that the drawings are simplified schematic illustrations and that the claims presented below encompass many more features that are not illustrated (or potentially many less) but that are commonly utilized with such devices and systems. Therefore, Applicants do not intend for the claims presented below to be limited by the attached drawings, but instead the attached drawings are merely provided to illustrate a few ways in which the claimed features can be implemented.

It will be appreciated that the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims. Unless specifically defined in a specific claim itself, steps or components of the systems and methods herein cannot be implied or imported from any above example as limitations to any particular order, number, position, size, shape, angle, color, or material.

What is claimed is:

1. An apparatus comprising:
 a relatively higher-voltage circuit adapted to provide output voltage to a load;
 a relatively lower-voltage circuit adjacent the relatively higher-voltage circuit, wherein the relatively lower-voltage circuit outputs a heater control signal; and
 a heater connected to receive the heater control signal from the relatively lower-voltage circuit,
 wherein the relatively higher-voltage circuit and the relatively lower-voltage circuit are positioned, relative to each other, to experience same environmental conditions,
 wherein the relatively higher-voltage circuit includes a transformer providing the output voltage,
 wherein the relatively lower-voltage circuit comprises a humidity sensor and an amplifier connected to the humidity sensor,
 wherein the amplifier is connected to receive:
  a first input from the humidity sensor; and
  a second input comprising a portion of the output voltage from the transformer that is a proportional voltage that is lower than, and proportional to, the output voltage,
 wherein the relatively lower-voltage circuit further comprises a signal converter connected to the amplifier and the heater, and
 wherein the signal converter supplies the heater control signal to the heater based on output from the amplifier.

2. The apparatus according to claim 1, wherein the relatively higher-voltage circuit and the relatively lower-voltage circuit have components sized and connected to experience proportional current changes as environmental conditions change.

3. The apparatus according to claim 1, further comprising a printed circuit board, wherein the relatively higher-voltage circuit and the relatively lower-voltage circuit are connected to the printed circuit board, and wherein the heater is one of:
 connected to an outer surface of the printed circuit board; or
 located within the printed circuit board.

4. The apparatus according to claim 1, wherein the same environmental conditions include at least humidity.

5. A printer comprising:
 a load comprising printing components;
 a relatively higher-voltage circuit adapted to provide output voltage to the load;
 a relatively lower-voltage circuit adjacent the relatively higher-voltage circuit, wherein the relatively lower-voltage circuit outputs a heater control signal; and
 a heater connected to receive the heater control signal from the relatively lower-voltage circuit,
 wherein the relatively higher-voltage circuit and the relatively lower-voltage circuit are positioned, relative to each other, to experience same environmental conditions,
 wherein the relatively higher-voltage circuit includes a transformer providing the output voltage,
 wherein the relatively lower-voltage circuit comprises a humidity sensor and an amplifier connected to the humidity sensor,
 wherein the amplifier is connected to receive:
  a first input from the humidity sensor; and
  a second input comprising a portion of the output voltage from the transformer that is a proportional voltage that is lower than, and proportional to, the output voltage,
 wherein the relatively lower-voltage circuit further comprises a signal converter connected to the amplifier and the heater, and
 wherein the signal converter supplies the heater control signal to the heater based on output from the amplifier.

6. The printer according to claim 5, wherein the relatively higher-voltage circuit and the relatively lower-voltage circuit have components sized and connected to experience proportional current changes as environmental conditions change.

7. The printer according to claim 5, further comprising a printed circuit board, wherein the relatively higher-voltage circuit and the relatively lower-voltage circuit are connected to the printed circuit board, and wherein the heater is one of:
  connected to an outer surface of the printed circuit board; or
  located within the printed circuit board.

* * * * *